(12) United States Patent
Velthuis et al.

(10) Patent No.: US 10,559,399 B2
(45) Date of Patent: Feb. 11, 2020

(54) MULTI-PHASE BUSBAR FOR ENERGY CONDUCTION

(71) Applicant: ABB Schweiz AG, Baden (CH)

(72) Inventors: Rudi Velthuis, Lauchringen (DE); Andrej Krivda, Wettingen (CH); Jens Rocks, Freienbach (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/445,249

(22) Filed: Jun. 19, 2019

(65) Prior Publication Data

US 2019/0304621 A1    Oct. 3, 2019

Related U.S. Application Data

(63) Continuation of application No. PCT/EP2017/083063, filed on Dec. 15, 2017.

(30) Foreign Application Priority Data

Dec. 19, 2016    (EP) ..................................... 16205013

(51) Int. Cl.
| | |
|---|---|
| *H01B 7/02* | (2006.01) |
| *H01B 13/06* | (2006.01) |
| *H01B 7/00* | (2006.01) |
| *H01B 7/08* | (2006.01) |
| *H01B 1/20* | (2006.01) |

(Continued)

(52) U.S. Cl.
CPC ........... *H01B 7/0216* (2013.01); *B32B 3/266* (2013.01); *B32B 15/01* (2013.01); *B32B 15/20* (2013.01);

(Continued)

(58) Field of Classification Search
CPC ........ H01B 7/0216; H01B 17/18; H01B 7/08; H01B 7/0208; H01B 7/0225; H02B 1/20; H01R 25/16; H02G 5/005
See application file for complete search history.

(56) References Cited

U.S. PATENT DOCUMENTS

| | | | | | |
|---|---|---|---|---|---|
| 3,660,726 | A | * | 5/1972 | Ammon ................. | H01R 12/58 |
| | | | | | 174/262 |
| 3,663,866 | A | * | 5/1972 | Iosue ..................... | H05K 1/185 |
| | | | | | 361/794 |

(Continued)

FOREIGN PATENT DOCUMENTS

| | | |
|---|---|---|
| DE | 102005015945 A1 | 10/2006 |
| WO | WO 2012135673 A2 | 10/2012 |

*Primary Examiner* — Hoa C Nguyen
*Assistant Examiner* — Amol H Patel
(74) *Attorney, Agent, or Firm* — Leydig, Voit & Mayer, Ltd.

(57) ABSTRACT

A multi-phase busbar can include a first conducting layer, a first conducting pin, a first insulating layer, and a second conducting layer. The first conducting layer can include a sheet metal coated with an electrically insulating material. The first conducting pin can be mounted to the first conducting layer. The first conducting pin can extend in a direction perpendicular to the first conducting layer. The first insulating layer of a rigid insulating material can be arranged on the first conducting layer. The first insulating layer can define an opening through which the first conducting pin projects. The second conducting layer can include a sheet metal coated with an electrically insulating material, the second conducting layer comprising a first pinhole through which the first conducting pin projects and a second conducting pin which extends in a direction parallel to the first conducting pin.

20 Claims, 7 Drawing Sheets

(51) Int. Cl.
  *B32B 15/01* (2006.01)
  *B32B 3/26* (2006.01)
  *B32B 15/20* (2006.01)
  *H02B 1/20* (2006.01)

(52) U.S. Cl.
  CPC ............ *H01B 7/009* (2013.01); *H01B 7/0225* (2013.01); *H01B 7/08* (2013.01); *H01B 13/06* (2013.01); *B32B 2255/06* (2013.01); *B32B 2255/26* (2013.01); *B32B 2307/202* (2013.01); *B32B 2307/206* (2013.01); *B32B 2457/00* (2013.01); *H02B 1/20* (2013.01)

(56) References Cited

U.S. PATENT DOCUMENTS

| | | | | |
|---|---|---|---|---|
| 3,893,233 | A * | 7/1975 | Glover | H01R 4/00 29/838 |
| 4,054,939 | A * | 10/1977 | Ammon | H02B 1/207 361/792 |
| 4,358,633 | A | 11/1982 | Reynolds, Jr. | |
| 4,358,663 | A * | 11/1982 | Sperner | F23Q 7/001 123/145 A |
| 4,571,322 | A * | 2/1986 | Eichelberger | H05K 3/445 264/154 |
| 4,694,123 | A * | 9/1987 | Massey | H02G 5/005 174/117 FF |
| 6,329,603 | B1 * | 12/2001 | Japp | H05K 3/4641 174/255 |
| 6,613,413 | B1 * | 9/2003 | Japp | H05K 3/38 174/255 |
| 7,119,563 | B2 * | 10/2006 | Casey | G01R 31/2889 324/756.05 |
| 7,557,298 | B2 * | 7/2009 | Vanhoutte | H02G 5/005 174/149 B |
| 2001/0025718 | A1 * | 10/2001 | Maruyama | H02G 3/16 174/72 B |

* cited by examiner

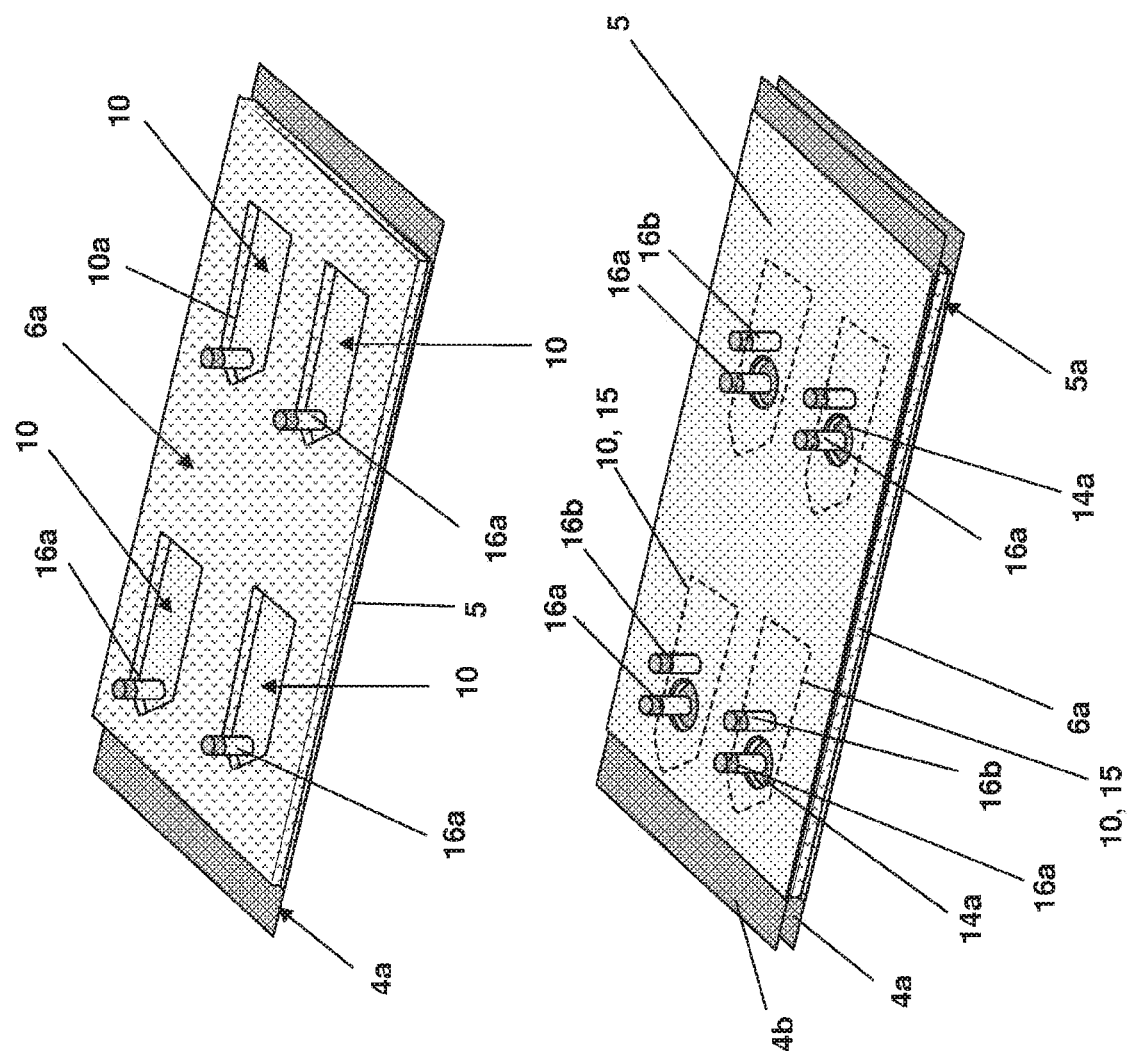

MULTI-PHASE BUSBAR FOR ENERGY CONDUCTION

CROSS-REFERENCE TO RELATED APPLICATION

The present application is a continuation of International Application No. PCT/EP2017/083063 to Velthuis et al., which was filed on Dec. 15, 2017 and published as International Publication No. WO 2018/114689A1. Both the International Application and the International Publication are hereby incorporated by reference. The International Application claims priority to European Application No. EP16205013.2, which was filed on Dec. 19, 2016.

FIELD

Among other things, the present application discloses a multi-phase busbar and a method of manufacturing the same.

BACKGROUND

Multi-phase busbars are used in switchboards and/or switchgears in particular low voltage switchgears, to conduct and distribute alternating electrical current to different electrical devices which are usually installed in switch gear cabinets. In order to provide for the possibility to conduct all three phases or even more phases of an alternating current in a single busbar, multi-phase busbars have been developed which comprise a base layer and a cover layer of electrically insulating material between which two or more layers of conducting sheet metal, in particular copper, are arranged that are electrically insulated from each other by means of insulating intermediate layers.

SUMMARY

A multi-phase busbar can include a first conducting layer, a first conducting pin, a first insulating layer, and a second conducting layer. The first conducting layer can include a sheet metal coated with an electrically insulating material. The first conducting pin can be mounted to the first conducting layer. The first conducting pin can extend in a direction perpendicular to the first conducting layer. The first insulating layer of a rigid insulating material can be arranged on the first conducting layer. The first insulating layer can define an opening through which the first conducting pin projects. The second conducting layer can include a sheet metal coated with an electrically insulating material, the second conducting layer comprising a first pinhole through which the first conducting pin projects and a second conducting pin which extends in a direction parallel to the first conducting pin.

The opening in the first insulating layer and the first pinhole in the second conducting layer can define a common recess through which the first conducting pin projects. The recess can be filled with a resin which forms a material bridge between the first conducting layer and the second conducting layer. The material bridge can mechanically clamp the first conducting layer, the first rigid insulating layer, and the second conducting layer together.

BRIEF DESCRIPTION OF THE DRAWINGS

Embodiments of the present invention will be described in even greater detail below based on the exemplary figures. The invention is not limited to the exemplary embodiments. All features described and/or illustrated herein can be used alone or combined in different combinations in embodiments of the invention. The features and advantages of various embodiments of the present invention will become apparent by reading the following detailed description with reference to the attached drawings which illustrate the following:

FIG. 3 is a schematic view of the exemplary conducting layer of FIG. 2 after positioning a first layer of rigid insulating material on the coating.

FIG. 4 is a schematic view of the exemplary busbar of FIG. 3 after arranging a second coated conducting layer on the first layer of rigid insulating material.

DETAILED DESCRIPTION

Figure 1:
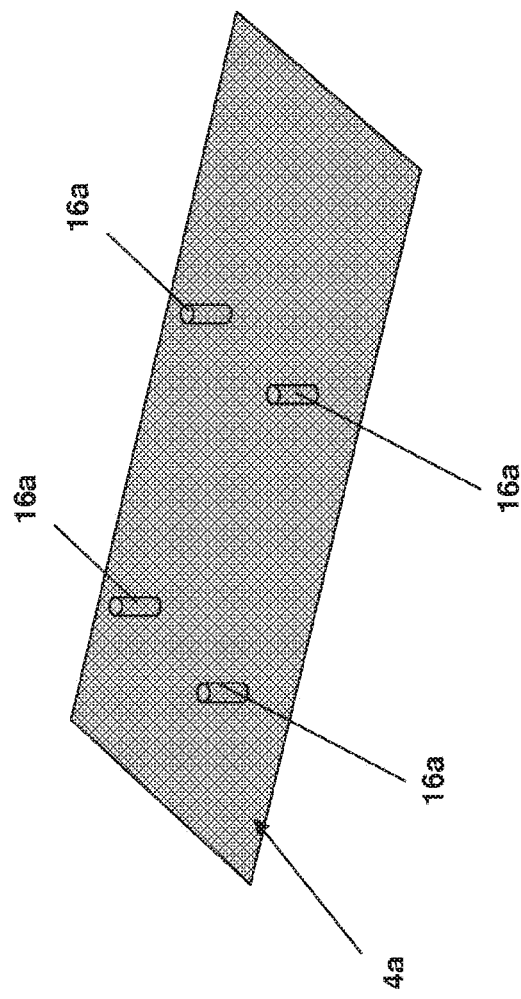
FIG. 1 is a schematic view of an exemplary first uncoated conducting layer.

A busbar in which the different layers are laminated to each other by means of liquid resin is described in DE 10 2005 015 945 B4 of the applicant. The laminated busbar has the advantage that it is compact and does not tend to delaminate due to repellant forces which are generated by the alternating electric currents that are conducted in the different conducting layers for each phase and which in case of a short circuit can be in the range of several thousand ampere (kA).

One problem of the busbars as described in DE 10 2005 015 945 B4 are the costs involved in the lamination process itself in which the different layers are bond to each other by means of a liquid resin, like epoxy resin, which is applied to the upper and lower side of each layer and cured afterwards. As the laminating resins used for the laminating process are usually toxic and are said to cause allergic reactions, specific safety precautions for the staff are required in the production process which significantly raise the production costs.

Accordingly, the present application discloses embodiments providing a multi-phase busbar that can be manufactured at reduced costs without the extensive application of a liquid resin to each layer for bonding the layers to each other.

The present application discloses embodiments offering the following technical advantages:
—High reliability as all copper plates are coated before the resin is cast around the pins. No additional machining or cover/coating on the pins and shipping splits are required. High flexibility on the arrangement of the pins as only the area around the pins is casted and no complex mold is required. —The busbar provides for the same size and loss reduction as a conventionally laminated busbar. —The combined coating and casting technology allows a highly automated processing of laminated busbars.

Moreover, the present application discloses embodiments with the following economic advantages: —Reduced handling steps as no complex mold is required. Especially, no tight sealing around the pins and shipping split areas are needed as the local clamping proved to be sufficient. —The casting can be performed without the use of vacuum if an appropriate resin is used. —No cleaning of the mold is required. —Reduced tooling costs as the machined/molded area around the pins itself is used as a mold. —In general lower production costs and faster assembly of the busbar compared to currently used systems.

The present application discloses a multi-phase busbar for conducting electric energy, comprising a first conducting layer made of a sheet metal which is coated with an electrically insulating material, a first conducting pin mounted to said first conducting layer which extends in a direction perpendicular to the first conducting layer, a first insulating layer of a rigid insulating material arranged on said first conducting layer, said first insulating layer having an opening through which the first conducting pin projects, a second conducting layer made of a sheet metal which is coated with an electrically insulating material, said second conducting layer comprising a first pinhole through which said first conducting pin projects and a second conducting pin which extends in a direction parallel to said first conducting pin, wherein said opening in said first insulating layer and said first pinhole in said second conducting layer define a common recess through which said first conducting pin projects, said recess being filled with a resin which forms a material bridge between the first conducting layer and the second conducting layer, said material bridge mechanically clamping said first conducting layer, said first rigid insulating layer and said second conducting layer together. In a further embodiment a second insulating layer of a rigid insulating material is arranged on said second conducting layer, said second layer of rigid insulating material having an opening which matches said first pinhole, said first pinhole in said second conducting layer and said openings in said first and second layers of insulating material defining a common recess in which the first and the second conducting pin are located and which is filled with resin forming a material bridge which mechanically clamps said first and second conducting layers and said first and second rigid insulating layers together.

Furthermore, in another embodiment a third and a fourth layer of a conducting material and a third layer of a rigid insulating material are arranged above each other on said second layer of rigid insulating material, wherein said third conducting layer comprises a first and second pinhole, said fourth conducting layer comprises a first, second and third pinhole and said third layer of rigid insulating material comprises an opening, wherein the first, second and third pinholes in the conducting layers and the openings in the first, second and third layers of rigid insulating material are in communication with each other and form a common recess in which the first, second and third conducting pins are located, said common recess being filled with a resin forming a material bridge which mechanically clamps said conducting layers and said layers of rigid insulating material.

Moreover, in a further embodiment a fourth layer of rigid insulating material having an opening which matches the first second and third pinholes in said second and third and fourth conducting layers are arranged on said fourth insulating layer, said opening communicating with said openings in said first, second and third layer of insulating material and said pinholes in said conducting layers, thereby forming a common recess which is filled with a resin which forms a material bridge that mechanically clamps the stack of conducting layers and layers of rigid insulating together.

In another embodiment one or more of the conducting layers are copper layers which are coated with a coating including an epoxy resin and/or that the layers of rigid insulating material consist of GPO-3, and/or that the resin is a thermosetting resin, and/or that the resin includes a photoinitiator. In a further embodiment at least one layer of rigid insulating material comprises thickness variations (washer, edge cover, shipping split) and/or may be made out of one piece by use of SMC (sheet moulding component plastics) or prepreg, wherein in case of flat plates GPO-3 parts may be glued to each other. Furthermore, at least the first pinholes in the second, third and fourth conducting layers and/or the openings in the first and/or second and/or third layer of insulating material may be aligned with each other.

In another embodiment, the at least one opening formed in the first layer of rigid insulating material comprises a continues edge which surrounds at least the first and the second conducting pins and/or the at least one opening in the first layer of rigid insulating material comprises an area which is larger, (e.g. at least four times as large) as the area of the cross section of the first pinhole. Furthermore, the first and second and/or the third layers of rigid insulating material may be substantially identical.

In a further embodiment the end portions of conducting layers comprise conducting edge portions in which no insulating coating is applied to the sheet metal.

Furthermore a method of manufacturing a multi-phase busbar according to any of the preceding embodiments can include: (1) forming a stack including: a) a first conducting layer, b) first layer of a rigid insulating material loosely arranged on said first conducting layer, c) a second conducting layer loosely arranged on said first layer of rigid insulating material and d) a second insulating layer loosely arranged on said second conducting layer.

The second conducting layer can include a first pin hole and said first conducting layer comprises a first conducting pin projecting through said first pinhole and a second conducting pin arranged at a distance to said first conducting pin and extending in a direction parallel to said first conducting pin.

The first layer of a rigid insulating material can include an opening having a larger size than said first pinhole and extending between said first and second conducting layers so as to communicate with said first pinhole and form a common recess, pressing said first and second conducting layers against each other so as to mechanically clamp the first layer of rigid insulating material between said conducting layers, filling up said common recess with a curable resin and curing said resin while pressing said first and second conducting layers against each other.

Figure 2:
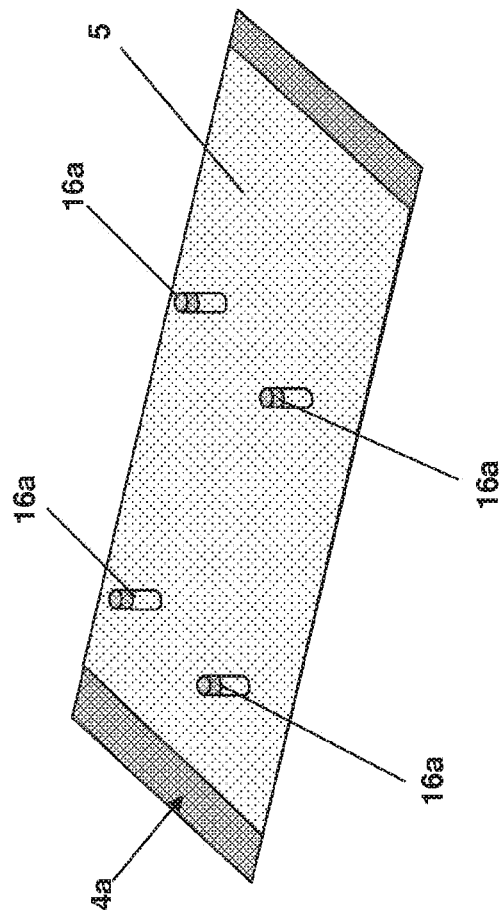
FIG. 2 is a schematic view of the exemplary conducting layer of FIG. 1 after applying the resin coating.

As it is shown in FIG. 1, a multi-phase busbar 1 for conducting electric energy, comprises a first conducting layer 4a which is made of a sheet metal, (e.g., copper or aluminum), which can have a thickness of 0.5 to 5 mm or 1 mm to 5 mm or even more. The first conducting layer 4a comprises at least one first conducting pin 16a, which extends in a direction perpendicular to the first conducting layer 4a and which is either integrally formed with the conducting layer 4a when manufacturing the same or which is soldered or mechanically attached to the sheet metal by screwing or clamping. As it is further shown in FIG. 2, a coating of an electrically insulating material 5, (e.g. epoxy resin), is applied to the sheet metal of the first conducting layer 4a except at the contacting portions at the sides of the sheet metal and the tops of the first conducting pins 16a which in the final product serves for electrically connecting the first conducting layer 4a to shipping splits and to electric devices (not shown).

On the coating 5 of the first conducting layer 4a, a first insulating layer 6a of a rigid insulating material is loosely positioned as it is shown in FIG. 3. The layer 6a can be a machined GPO-3 plate material or another known composite material which is composed of reinforcing fibers and a cured resin. The first insulating layer 6a which may have a thickness of 1 mm to 5 mm or more depending on the specific operational purpose and design of the busbar, comprises an opening 10 which extends at least around the area of the first conducting pin 16a and can be also underneath the area, where the second conducting pin 16b is positioned when positioning a second conducting layer 4b on the first insulating layer 6a as it is shown in FIG. 4. In the same way as the first conducting layer 4a the second conducting layer 4b is coated with an insulating material 5, except in the contacting portions where the shipping splits and electric devices are to be connected to the second conducting layer 4b. As it is further indicated by dashed lines in FIG. 4, further openings 10 may be formed in the first insulating layer 6a of rigid insulating material in the sections where further first and second conducting pins 16a, 16b are mounted to the first conducting layers 4a, 4b, so that there may be formed four or even more of such openings 10 each of which is having a continues edge 10a which surrounds at least the first and the second conducting pins 16a, 16b.

As it can further be seen from FIG. 4, the second conducting layer 4b comprises a first pinhole 14a around each of the conducting pins 16a through which the first conducting pins 16a project, respectively. This first pinhole 14a communicates with the opening 10 in the first insulating layer 6a and thereby defines a common recess 15 through which the first conducting pins 16a project. As a next step for producing a multi-phase busbar 1 having two conducting layers 4a, 4b which represents the minimum configuration of a busbar according to the present invention, the entire stack including the two conducting layers 4a, 4b and also the first insulating layer 6a is aligned. This alignment may be done by means of a mask (not shown) which comprises holes at the positions where the first and second conducting pins 16a, 16b are located, and stops (not shown) against which the edges of the layers may abut.

In a next step the common recesses 15 are filled up with a curable resin 17 which is injected into the first pinholes 16a and penetrates into the openings 10, as it will be described hereinafter with reference to FIGS. 6a and 6b, in which an embodiment of a busbar 1 is shown which comprises four conducting layers 4a to 4d.

Figure 6A:
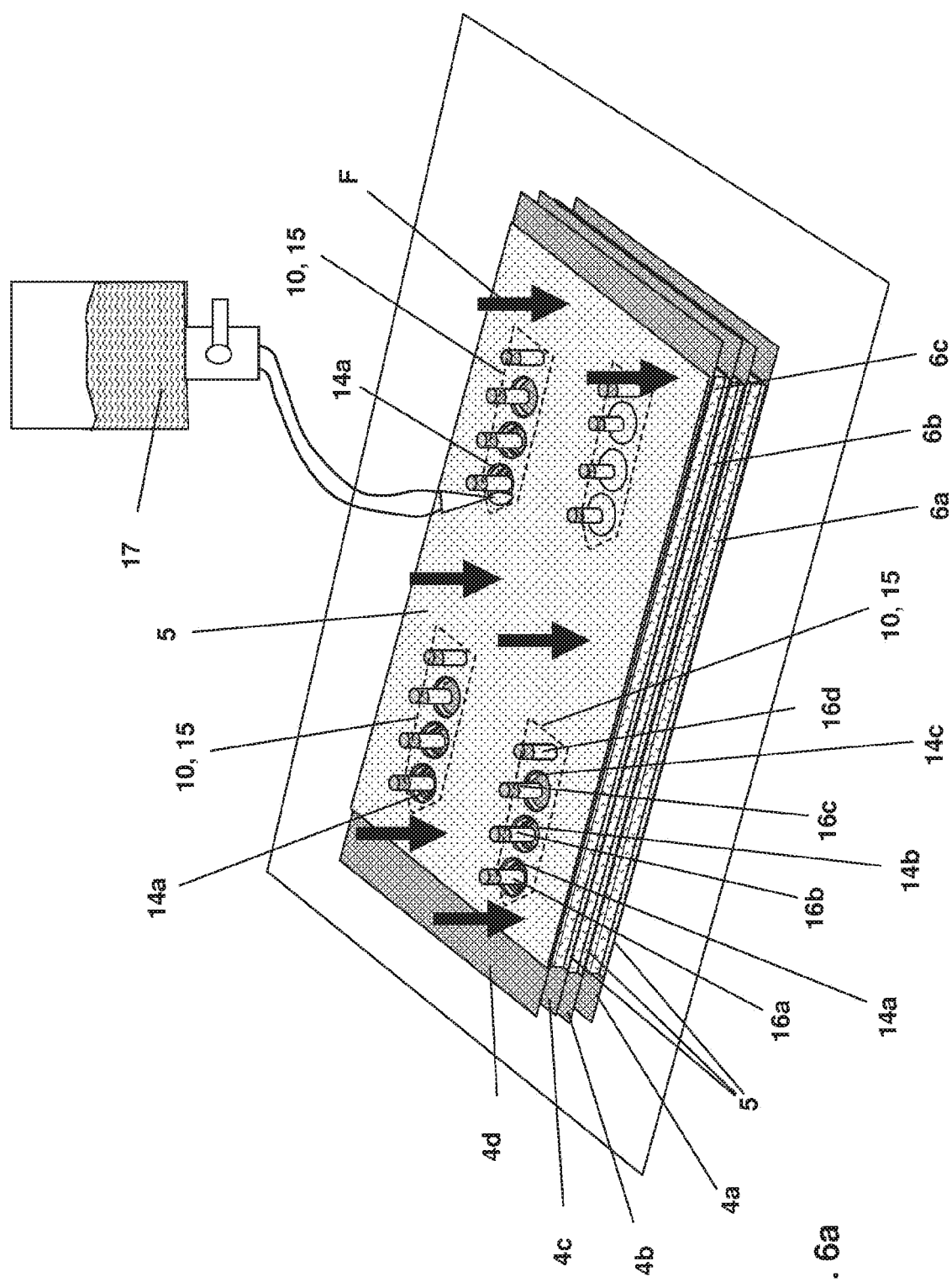
FIG. 6a is a schematic view of the exemplary busbar of FIG. 4 after arranging a third and fourth coated conducting layer and a second and third intermediate layer of rigid insulating material on the second coated conducting layer while pressing the layers together and casting resin into the common recesses around the first conducting pins.
Figure 6B:
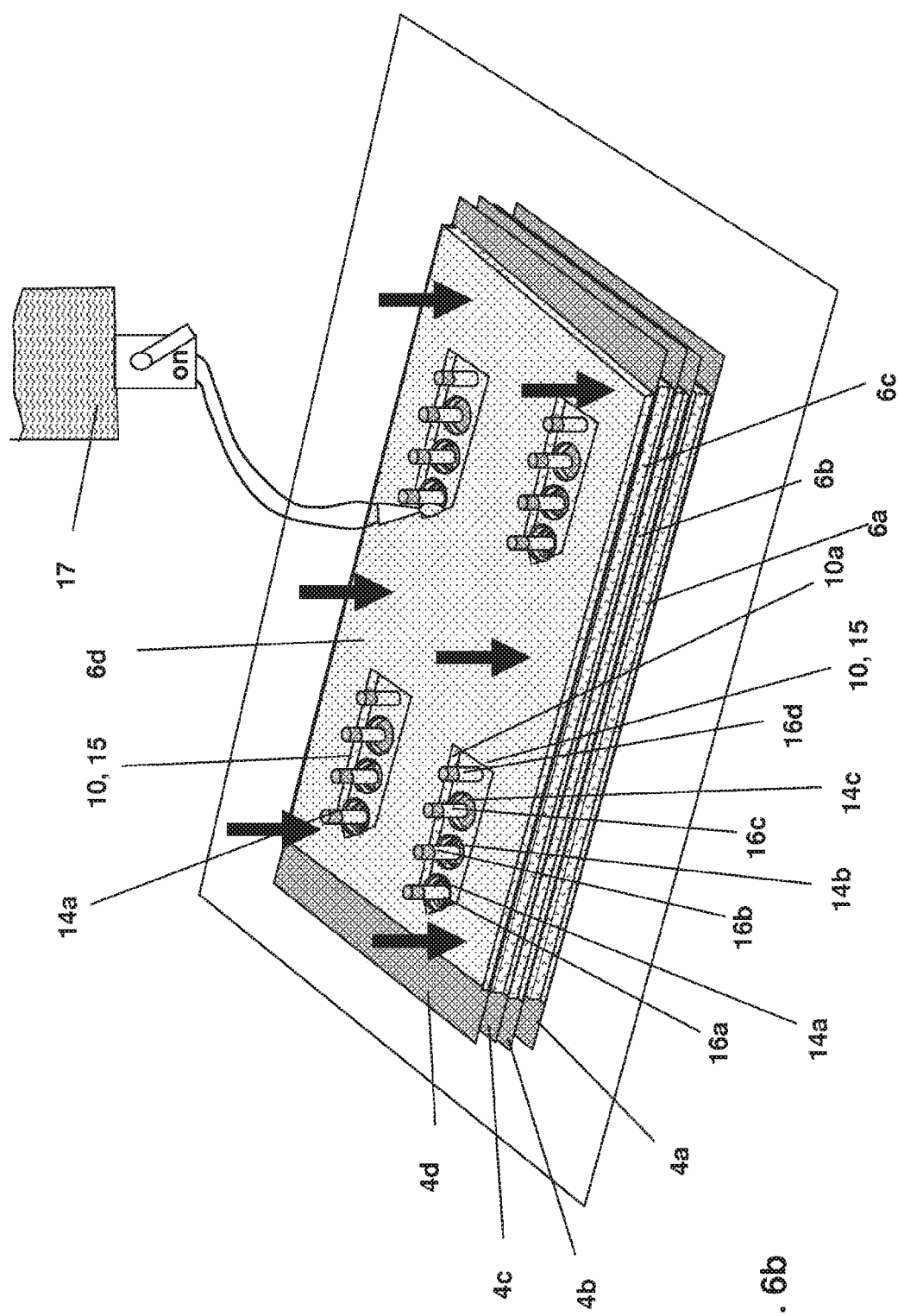
FIG. 6b is a schematic view of the exemplary busbar of FIG. 4 after arranging a third and fourth coated conducting layer and a second, third and fourth intermediate layer of rigid insulating material on the second coated conducting layer while pressing the layers together and casting resin into the common recesses around the first conducting pins.

While filling the recesses 15 with the curable resin 17, pressure is applied to the upper and lower layers of the stack as it is indicated by arrows F in FIGS. 6a and 6b. The pressure F which can be applied as a clamping force by vises (not shown) avoids that the resin 17 penetrates from the common recesses 15 into gaps which may be formed between the different layers.

The resin 17 may be a 2-component resin formulation which is prepared by mixing the two components right before filling up the common recesses 15, but may also be a thermosetting resin. The resin 17 may optionally include a photoinitiator, in particular a UV-initiator which can be activated by applying UV-light from a light source (not shown) in order to provide for an initial bonding of the layers 4a, 4b and 6a prior to a final curing of the resin. This advantageously allows the positioning masks to be removed right after the initial UV-curing of the resin in the first pinholes 14a which can then be used for the production of a next busbar 1.

Figure 5:
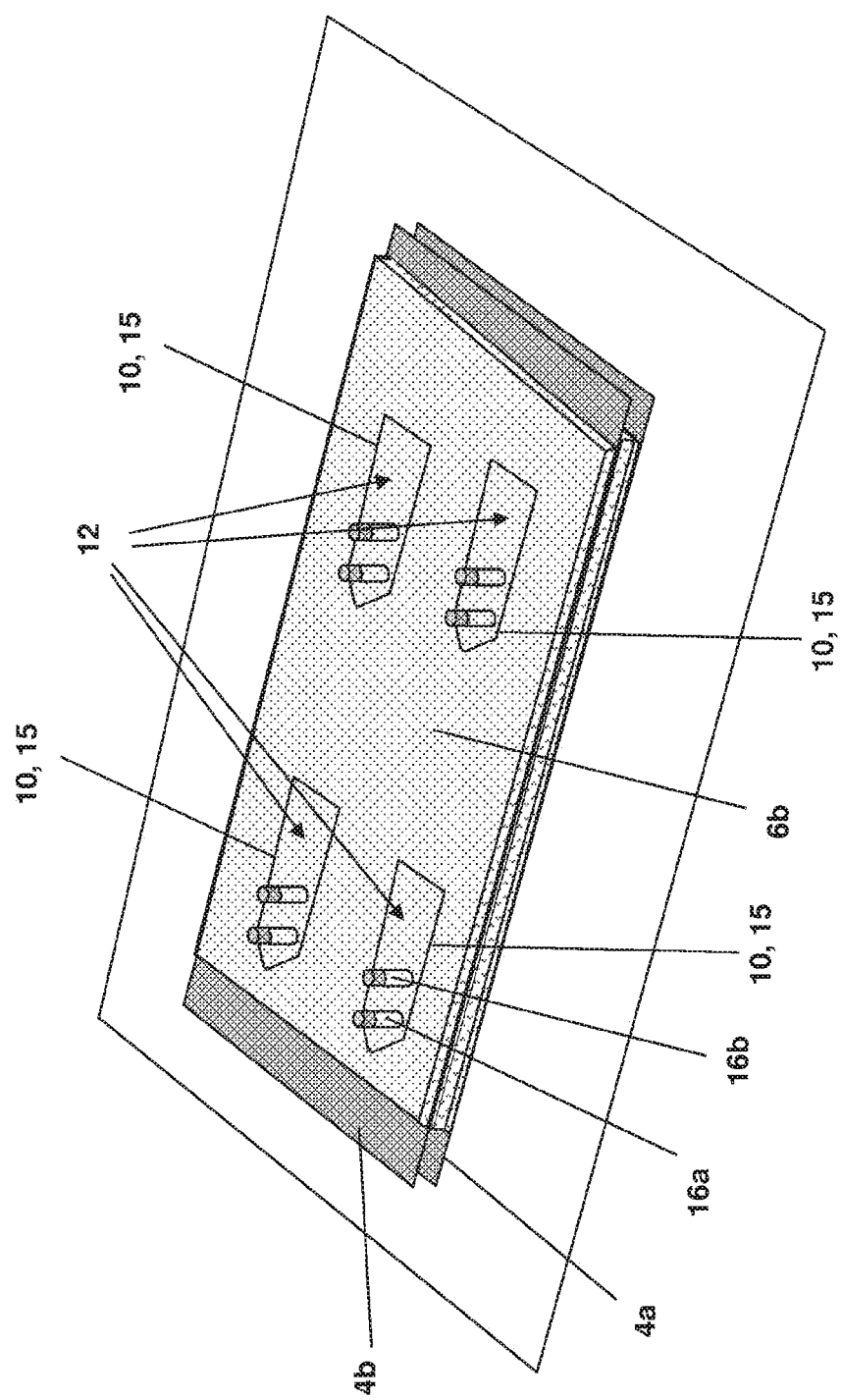
FIG. 5 is a schematic view of the exemplary busbar of FIG. 4 after positioning a second layer of rigid insulating material on the second coating layer and filling up the common recess through with curable resin, to provide an exemplary minimum-configuration of a busbar having only two conducting layers.

After the curing of the resin 17, which may also be accelerated by putting the stack into an oven, the resin 17 in the common recesses 15 forms a material bridge 12 between the first conducting layer 4a, the first insulating layer 6a and the second conducting layer 4b which mechanically clamps said first conducting layer 4a, said first rigid insulating layer 6a and said second conducting 4b layer together. According to another embodiment of a busbar 1 having two conducting layers 4a, 4b, a second insulating layer 6b of a rigid insulating material is arranged on the second conducting layer 4b, as it is shown in FIG. 5. The second rigid insulating layer 6 can be identical to the first rigid insulating layer 6a and comprises an opening 10 which surrounds the first and second conducting pins 16a, 16b and matches the first pinhole 14a, so that the first pinhole 14a in the second conducting layer 4b and the openings 10 in the first rigid insulating layers 6a, 6b are in fluid communication and define a common recess 15 in which the first and the second conducting pins 16a, 16b project in parallel to each other.

In order to permanently clamp the four layers 4a, 4b, 6a and 6b together, the stack of loosely superposed layers is aligned and mechanically pressed together while filling the liquid curable resin 17 into the common recess 15. As it can be seen from FIG. 5, the liquid resin 17 is fed into the common recess 15 until the entire opening 10 in the second rigid insulating layer 6b which forms a part of the common recess 15 is entirely filled up with resin. After the curing of the resin, the resin in the filled-up recess 10 can also form part of the material bridge 12 which advantageously comprises an enlarged clamping area as compared to the embodiment of the busbar 1 shown in FIG. 4.

According to the embodiment of a busbar 1 which comprises altogether 4 electrically conducting layers 4a, 4b, 4c and 4d, a third and a fourth layer 4c, 4d of a conducting material and a third layer 6c of a rigid insulating material are arranged above each other on the second layer 6b of rigid insulating material, as it is shown in FIG. 6a. The third conducting layer 4c comprises a first and second pinhole 14a, 14b, whereas the fourth conducting layer comprises a first, second and third pinhole 14a, 14b, 14c, in the centers of which the three conducting pins 16a to 16c can be centrally arranged, respectively. The third layer 6c of rigid material which can be identical to the other layers 6a and 6b comprises an opening 10 (indicated in dashed lines) which is in fluid communication with the first, second and third pinholes 14 in the conducting layers 4b to 4d as well as the openings 10 in the first, second and third layers 6a 6b, 6c of rigid insulating material and forms part of a common recess 15 in which the first, second and third conducting pins 16a, 16b and 16c project. In the same way as described herein before the stack of layers is aligned and clamped together before filling in the liquid resin 17.

Figure 7A:
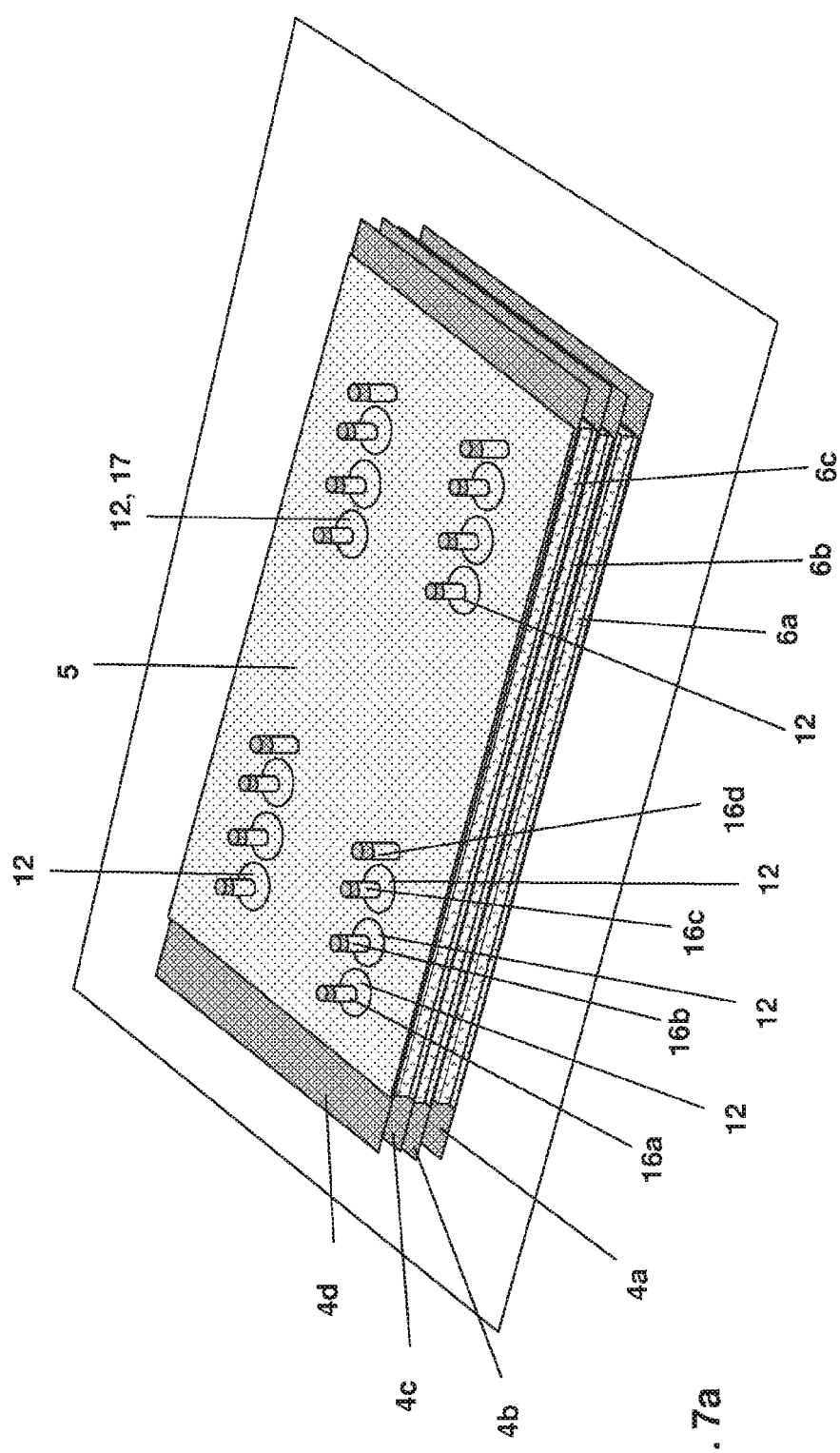
FIG. 7a is a schematic view of the exemplary final product of the exemplary busbar of FIG. 6a after curing the resin.

As shown in FIG. 6a, the resin 17 can be injected into the openings 14a which extend through all layers except the lower conducting layer 4a. After the curing of the resin which may also include reinforcing fibers (not shown) the hardened resin forms a material bridge 12 which mechanically clamps the conducting layers 4a, 4b and the layers 6a to 6c of rigid insulating material together as it is shown in FIG. 7a.

As the applicant has found, the clamping of the layers by the material bridges 12 of cured resin also increase the shear resistance of the stack in a lateral direction, that is in the plane of the layers, due to the frictional forces generated. This in turn reduces the danger of a delamination of the busbars 1 by the repellant magnetic forces which are generated in case of a short circuit.

Figure 7B:
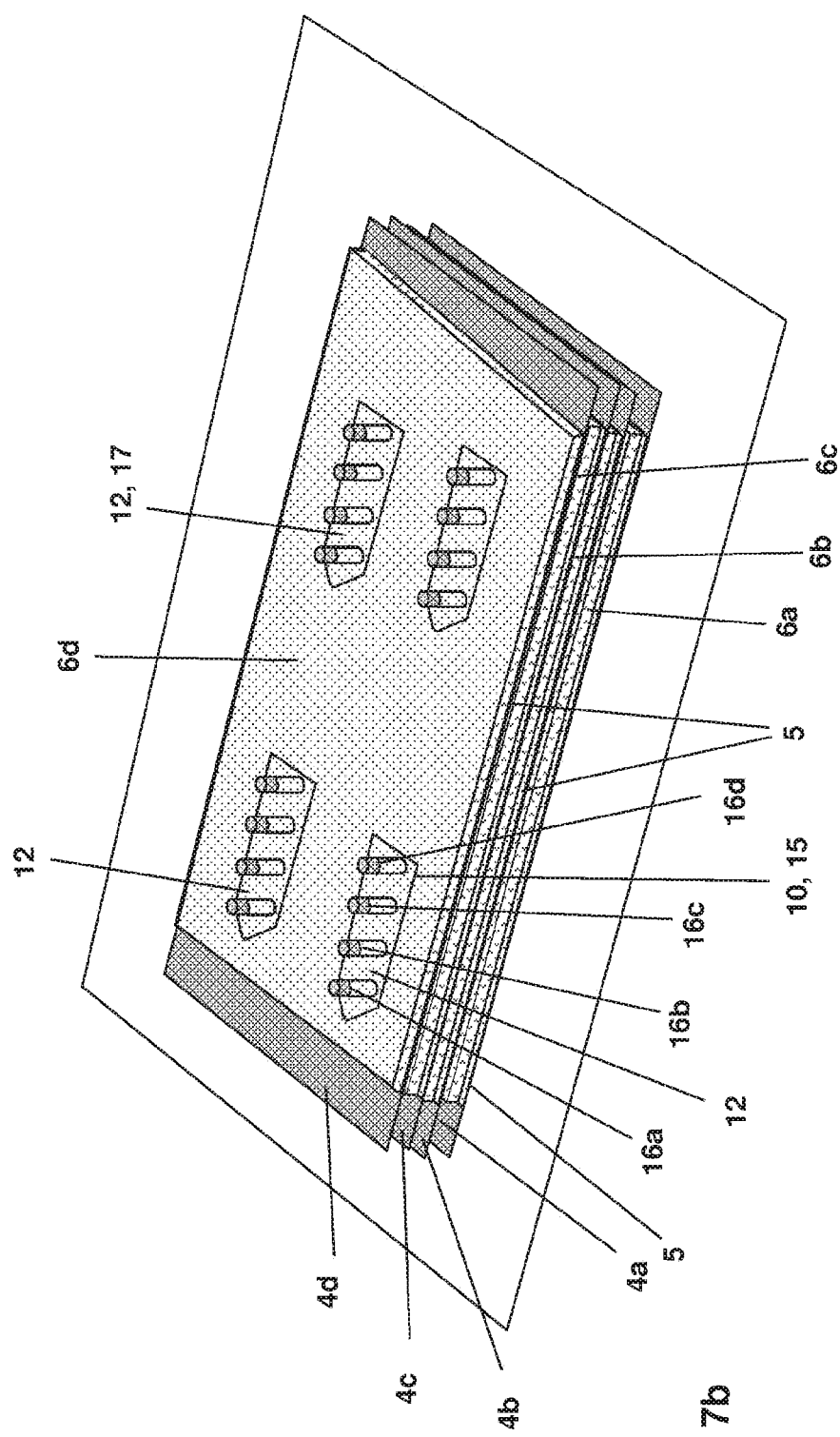
FIG. 7b is a schematic view of the exemplary final product of the exemplary busbar of FIG. 6b after curing the resin.

According to an embodiment of the invention which is shown in FIGS. 6b and 7b, a fourth layer of rigid insulating material 6d is arranged on said fourth insulating layer 4d. The fourth insulating layer 4d comprises an opening 10 which matches the first second and third pinholes 14a, 14b and 14c in said first second and third conducting layers 4a to 4c and is in fluid communication with the openings 10 which are formed in the first, second and third layers 6a to 6c of rigid insulating material and the pinholes 14a to 14c in the conducting layers 4a to 4c. The opening 10 in the fourth layer 6d of rigid insulating material forms part of a common recess 15 which is filled up with a curable resin as shown in FIG. 6b, in order to generate a material bridge 12 which mechanically clamps the sandwich of conducting layers 4a to 4d and rigid insulating layers 6a to 6d in the final busbar 1 as it is shown in FIG. 7b.

In the above-described embodiments of the invention (i.e., exemplary embodiments), the layers 4 and 6 are advantageously mechanically attached to each other by the material bridges of the cured resin 12 only, without employing additional adhesives between the layers. In embodiments of the invention, the openings 10 in the first layer 6a and/or second layer 6b and/or third layer 6c and/or fourth layer 6d of rigid insulating material cover an area which is larger, for example at least four times as large, as the area which is covered by the cross section of the first, second and third pinhole 14 a to 14c which can be identical in shape. By means of this, a toothing interaction of the material bridges 12 is generated which further increases the mechanical stability of the busbar 1.

While embodiments of the invention have been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LISTING OF REFERENCE NUMERALS 1 busbar
4a first conducting layer
4b second conducting layer
4c third conducting layer
4d fourth conducting layer
6a first intermediate layer
6b second intermediate layer
6c third intermediate layer
6d fourth intermediate layer
10 opening
10a continuous edge of opening
12 material bridges
14a first pinholes
14b second pinholes
14c third pinholes
15 common recess
16a first conducting pins
16b second conducting pins
16c third conducting pins
16d fourth conducting pins
17 resin
F compressive force

We claim:

1. A multi-phase busbar for conducting electric energy, the busbar comprising:
   a first conducting layer comprising a sheet metal coated with an electrically insulating material,
   a first conducting pin mounted to the first conducting layer, the first conducting pin extending in a direction perpendicular to the first conducting layer,
   a first insulating layer of a rigid insulating material arranged on the first conducting layer, the first insulating layer defining an opening through which the first conducting pin projects, and
   a second conducting layer comprising a sheet metal coated with an electrically insulating material, the second conducting layer comprising a first pinhole through which the first conducting pin projects and a second conducting pin which extends in a direction parallel to the first conducting pin,
   wherein the opening in the first insulating layer and the first pinhole in the second conducting layer define a common recess through which the first conducting pin projects, the recess being filled with a resin which forms a material bridge between the first conducting layer and the second conducting layer, the material bridge mechanically clamping the first conducting layer, the first rigid insulating layer, and the second conducting layer together.

2. The busbar of claim 1, wherein a second insulating layer of a rigid insulating material is arranged on the second conducting layer, the second layer of rigid insulating material defining an opening which matches the first pinhole, the first pinhole in the second conducting layer and the openings in the first and second layers of insulating material defining a common recess in which the first and the second conducting pin are located and which is filled with resin forming a material bridge which mechanically clamps the first and second conducting layers and the first and second rigid insulating layers together.

3. The busbar of claim 2, wherein a third and a fourth layer of a conducting material and a third layer of a rigid insulating material are arranged above each other on the second layer of rigid insulating material, wherein the third conducting layer comprises a first and second pinhole, the fourth conducting layer comprises a first, second and third pinhole and the third layer of rigid insulating material comprises an opening, wherein the first, second and third pinholes in the conducting layers and the openings in the first, second and third layers of rigid insulating material are in communication with each other and form a common recess in which the first, second and third conducting pins are located, the common recess being filled with a resin forming a material bridge which mechanically clamps the conducting layers and the layers of rigid insulating material.

4. The busbar of claim 3, wherein a fourth layer of rigid insulating material having an opening that matches the first second and third pinholes in the second and third and fourth conducting layers is arranged on the fourth insulating layer, the opening communicating with the openings in the first, second and third layer of insulating material and the pinholes in the conducting layers, thereby forming a common recess which is filled with a resin which forms a material bridge that mechanically clamps the stack of conducting layers and layers of rigid insulating together.

5. The busbar of claim 4, wherein (i) one or more of the conducting layers are copper layers which are coated with a coating including an epoxy resin (ii) the layers of rigid insulating material consist of GPO-3, (iii) the resin is a thermosetting resin, and/or (iv) the resin includes a photoinitiator.

6. The busbar of claim 4, wherein at least the first pinholes in the second, third and fourth conducting layers and/or the openings in the first and/or second and/or third layer of insulating material are aligned with each other.

7. The busbar of claim 4, wherein the at least one opening formed in the first layer of rigid insulating material comprises a continuous edge which surrounds at least the first and the second conducting pins and/or the at least one opening in the first layer of rigid insulating material comprises an area which is at least four times as large as the area of the cross section of the first pinhole.

8. The busbar of claim 7, wherein the first and second and/or the third layers of rigid insulating material are substantially identical.

9. The busbar of claim 7, wherein the end portions of conducting layers comprise conducting edge portions in which no insulating coating is applied to the sheet metal.

10. A multi-phase busbar comprising:
a first conducting layer comprising a metal and an electrically insulating coating,
a first conducting pin mounted to the first conducting layer,
a first insulating layer arranged on the first conducting layer, the first insulating layer defining an opening through which the first conducting pin projects, and
a second conducting layer comprising a metal and an electrically insulating coating, the second conducting layer comprising a first pinhole through which the first conducting pin projects and a second conducting pin, wherein the opening in the first insulating layer and the first pinhole in the second conducting layer define a common recess through which the first conducting pin projects.

11. The busbar of claim 10, wherein the recess is filled with a resin forming a material bridge between the first conducting layer and the second conducting layer, the material bridge mechanically clamping the first conducting layer, the first insulating layer, and the second conducting layer together.

12. The busbar of claim 11, wherein the first insulating layer is rigid.

13. The busbar of claim 10, wherein the first conducting pin extends in a direction perpendicular to the first conducting layer.

14. The busbar of claim 13, wherein the second conducting pin extends in a direction to the first conducting pin.

15. The busbar of claim 10, wherein a second insulating layer of a rigid insulating material is arranged on the second conducting layer, the second layer of rigid insulating material defining an opening that matches the first pinhole.

16. The busbar of claim 15, wherein the first pinhole in the second conducting layer and the openings in the first and second layers of insulating material define a common recess in which the first and the second conducting pin are located and which is filled with resin forming a material bridge which mechanically clamps the first and second conducting layers and the first and second rigid insulating layers together.

17. The busbar of claim 15, wherein a third and a fourth layer of a conducting material and a third layer of a rigid insulating material are arranged above each other on the second layer of insulating material.

18. The busbar of claim 17, wherein the third conducting layer comprises a first and second pinhole, the fourth conducting layer comprises a first, second and third pinhole and the third layer of rigid insulating material comprises an opening, wherein the first, second and third pinholes in the conducting layers and the openings in the first, second and third layers of rigid insulating material are in communication with each other and form a common recess in which the first, second and third conducting pins are located, the common recess being filled with a resin forming a material bridge which mechanically clamps the conducting layers and the layers of rigid insulating material.

19. The busbar of claim 18, wherein the first pinholes in the second, third and fourth conducting layers and the openings in the first, second, and third layer of insulating material are aligned with each other.

20. A method of manufacturing a multi-phase busbar, the method comprising:
forming a stack comprising: a first conducting layer, a first layer of a rigid insulating material loosely arranged on the first conducting layer, a second conducting layer loosely arranged on the first layer of rigid insulating material and a second insulating layer loosely arranged on the second conducting layer,
wherein the second conducting layer comprises a first pin hole and the first conducting layer comprises a first conducting pin projecting through the first pinhole and a second conducting pin arranged at a distance to the first conducting pin and extending in a direction parallel to the first conducting pin, and
wherein the first layer of a rigid insulating material comprises an opening having a larger size than the first pinhole and extending between the first and second conducting layers so as to communicate with the first pinhole and form a common recess, pressing the first and second conducting layers against each other so as to mechanically clamp the first layer of rigid insulating material between the conducting layers, filling up the common recess with a curable resin and curing the resin while pressing the first and second conducting layers against each other.

* * * * *